US012165739B2

(12) United States Patent
Jain et al.

(10) Patent No.: US 12,165,739 B2
(45) Date of Patent: *Dec. 10, 2024

(54) SYSTEMS AND METHODS FOR CONTROLLING POWER MANAGEMENT OPERATIONS IN A MEMORY DEVICE

(71) Applicant: Taiwan Semiconductor Manufacturing Company, Ltd., Hsinchu (TW)

(72) Inventors: Sanjeev Kumar Jain, Ottawa (CA); Sahil Preet Singh, Amritsar (IN); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,818

(22) Filed: Aug. 9, 2023

(65) Prior Publication Data

US 2023/0386537 A1 Nov. 30, 2023

Related U.S. Application Data

(63) Continuation of application No. 17/722,453, filed on Apr. 18, 2022, now Pat. No. 11,763,863, which is a
(Continued)

(51) Int. Cl.
*G11C 7/00* (2006.01)
*G11C 7/10* (2006.01)
(Continued)

(52) U.S. Cl.
CPC ............... *G11C 7/12* (2013.01); *G11C 7/106* (2013.01); *G11C 7/1087* (2013.01); *G11C 7/20* (2013.01)

(58) Field of Classification Search
CPC ....................................................... G11C 7/12
(Continued)

(56) References Cited

U.S. PATENT DOCUMENTS 7,414,911 B2   8/2008   Choi et al.
9,886,988 B1   2/2018   Wang
(Continued)

FOREIGN PATENT DOCUMENTS

TW   I630613   7/2018

OTHER PUBLICATIONS

Korean Office Action, Application No. 10-2021-0024167, dated Dec. 14, 2021.
Taiwanese Notice of Allowance; Application No. 110128625; dated Mar. 28, 2022.
German Office Action; Application No. 102021100494.2; dated Feb. 8, 2023.

*Primary Examiner* — Hoai V Ho
(74) *Attorney, Agent, or Firm* — Jones Day

(57) ABSTRACT

Systems and methods are provided for controlling a wake-up operation of a memory circuit. The memory circuit may include a memory array with a plurality of memory cells, first logic circuitry, first switching circuitry, first latch circuitry, and second switching circuitry. The first logic circuitry may be configured to generate a first bit line pre-charge signal for a first memory cell of the plurality of memory cells, where the first bit line pre-charge signal is generated in response to a sleep signal. The first switching circuitry may be configured to provide power to one or more bit line of the first memory cell in response to the first bit line pre-charge signal. The first latch circuit may receive the sleep signal and the first bit line pre-charge signal and generate a delayed sleep signal. The second logic circuitry may be configured to generate a second bit line pre-charge signal for a second memory cell of the plurality of memory
(Continued)

cells, where the second bit line pre-charge signal is generated in response to the delayed sleep signal. The second switching circuitry may be configured to provide power to one or more bit line of the second memory cell in response to the second bit line pre-charge signal.

20 Claims, 11 Drawing Sheets

Related U.S. Application Data continuation of application No. 17/140,318, filed on Jan. 4, 2021, now Pat. No. 11,309,000.

(60) Provisional application No. 63/072,310, filed on Aug. 31, 2020.

(51) Int. Cl.
*G11C 7/12* (2006.01)
*G11C 7/20* (2006.01)

(58) Field of Classification Search
USPC .......................................................... 365/203
See application file for complete search history.

(56) References Cited

U.S. PATENT DOCUMENTS

| | | |
|---|---|---|
| 11,309,000 B2 | 4/2022 | Jain et al. |
| 11,763,863 B2 * | 9/2023 | Jain .......................... G11C 7/20 365/203 |
| 2005/0286322 A1 | 12/2005 | Choi et al. |
| 2006/0164904 A1 | 7/2006 | Saleh |
| 2010/0246299 A1 | 9/2010 | Iwai et al. |
| 2012/0287741 A1 | 11/2012 | Ashizawa |

\* cited by examiner

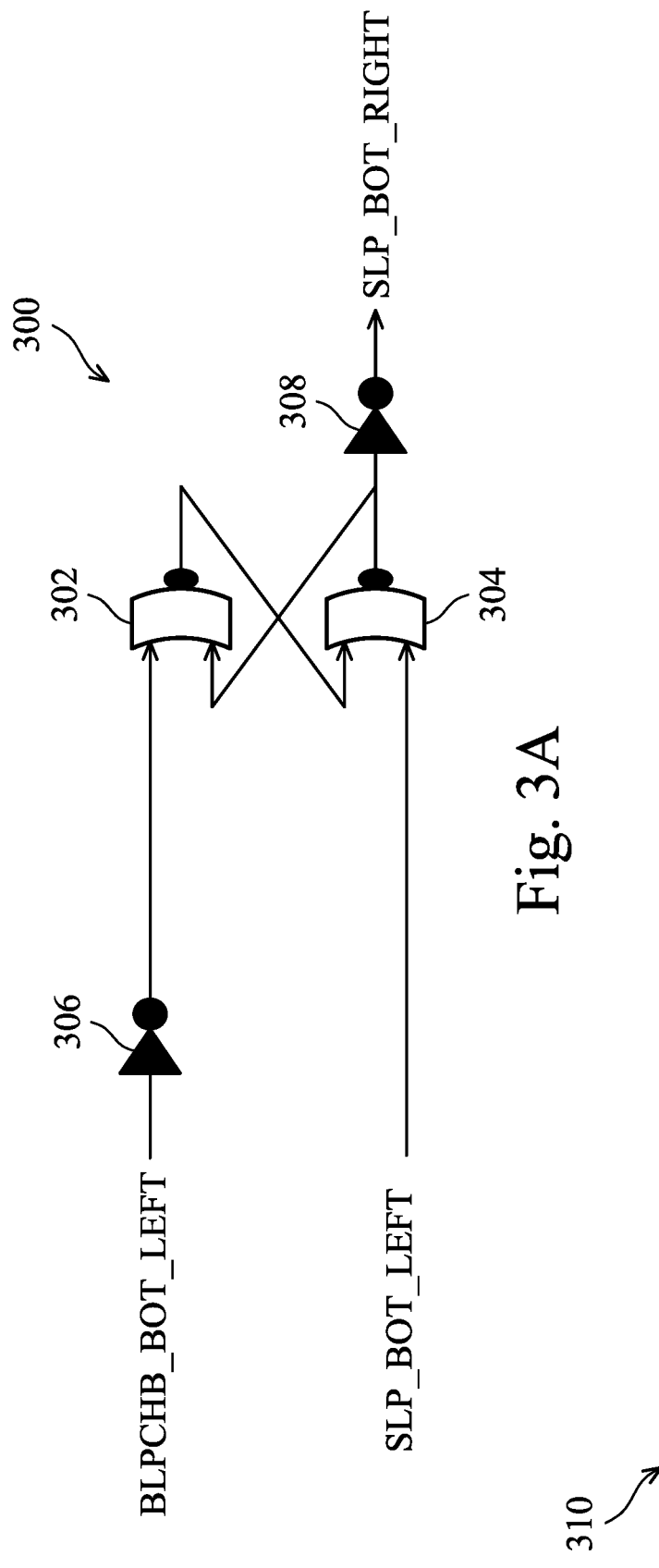

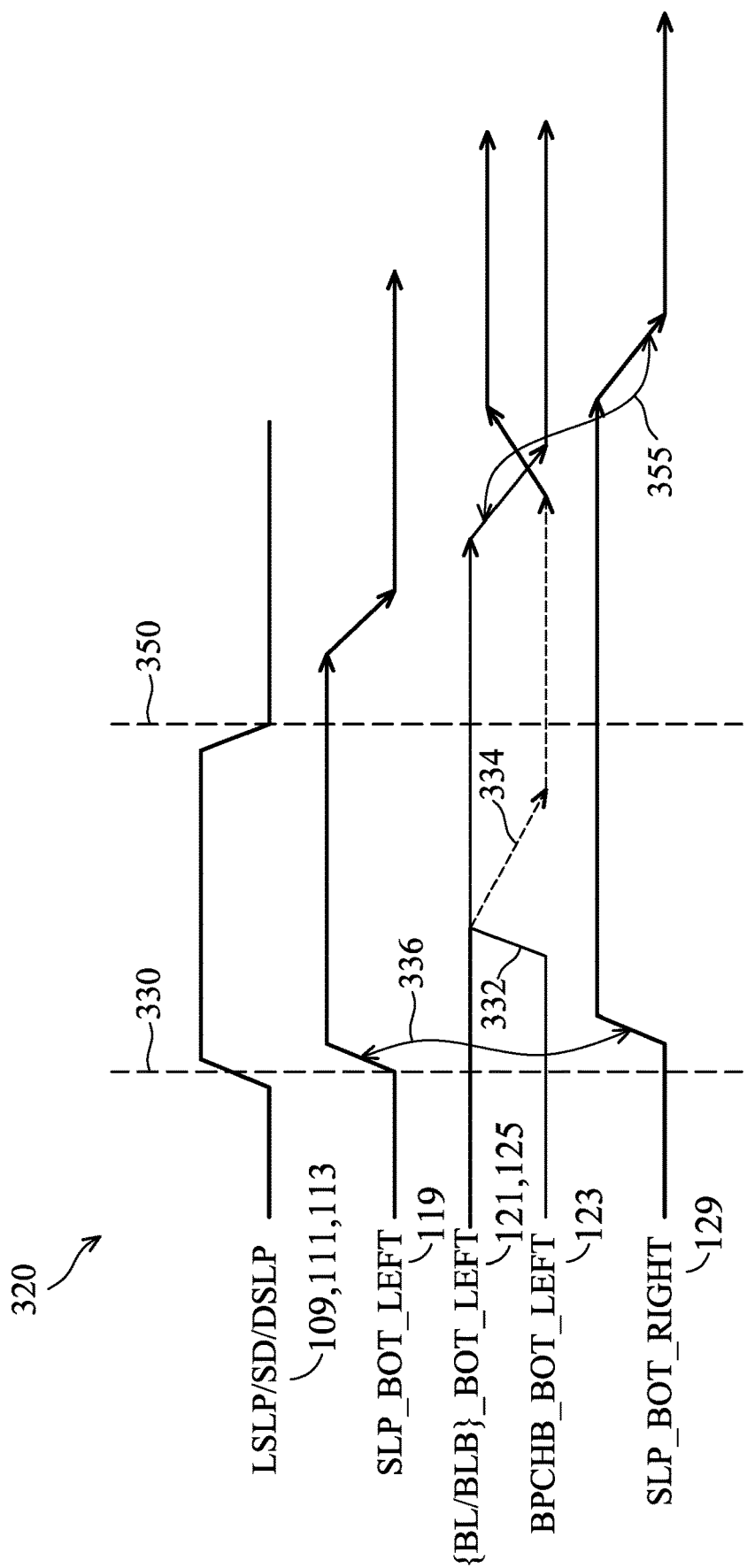

SYSTEMS AND METHODS FOR CONTROLLING POWER MANAGEMENT OPERATIONS IN A MEMORY DEVICE

CROSS-REFERENCE TO RELATED APPLICATIONS

This application is a continuation of U.S. patent application Ser. No. 17/722,453, filed Apr. 18, 2022, entitled "Systems and Methods for Controlling Power Management Operations in a Memory Device", which is a continuation of U.S. patent application Ser. No. 17/140,318, filed Jan. 4, 2021, now U.S. Pat. No. 11,309,000, issued Apr. 19, 2022, entitled "Systems and Methods for Controlling Power Management Operations in a Memory Device", which claims priority to U.S. Provisional Application No. 63/072,310, filed Aug. 31, 2020, entitled "Bit Line Pre-Charge Tracking Circuit for Power Management Modes in SRAM", each of which is incorporated herein by reference in their entirety.

TECHNICAL FIELD

The technology described in this patent document relates generally to semiconductor memory systems, and more particularly to power management systems and methods for a semiconductor memory system.

BACKGROUND

Power gates are often used to turn off periphery and memory array in a low power SRAM. When memory comes out of a sleep mode (e.g., shut-down, deep sleep, and light sleep), large power gates are typically used to ramp up the internal supply voltage of the memory. In a typical design, providing a short wake-up time for the internal supply voltage leads to large in-rush current. There is typically a design trade-off between in-rush current (e.g., wakeup peak current) and the memory wake-up time.

The word line internal supply and bit line pre-charge circuit of a memory system are typically turned off during light sleep mode. Memory design criteria often requires maintaining a wake-up peak current that is smaller than the mission mode (R/W operation) peak current, particularly during light sleep mode. Some known memory systems fail to meet this criteria during light sleep wake-up because bit lines are pre-charged at almost the same time within a memory bank.

Sequential wakeup is a technique that is used to reduce wake-up peak current in a memory system. However, in many known systems employing a sequential wake-up technique, it is difficult to match the bit line pre-charge signal and sleep signal delay across all memory macros and PVTs. As a result, bit lines are pre-charged at almost the same time on the left and right sides of the memory array.

BRIEF DESCRIPTION OF THE DRAWINGS

Aspects of the present disclosure are best understood from the following detailed description when read with the accompanying FIGURES.

FIGS. 3A-3C depict an example of an SR latch that may, for example, be utilized as one or more of the latch circuits in FIG. 1.

DETAILED DESCRIPTION

Figure 1:
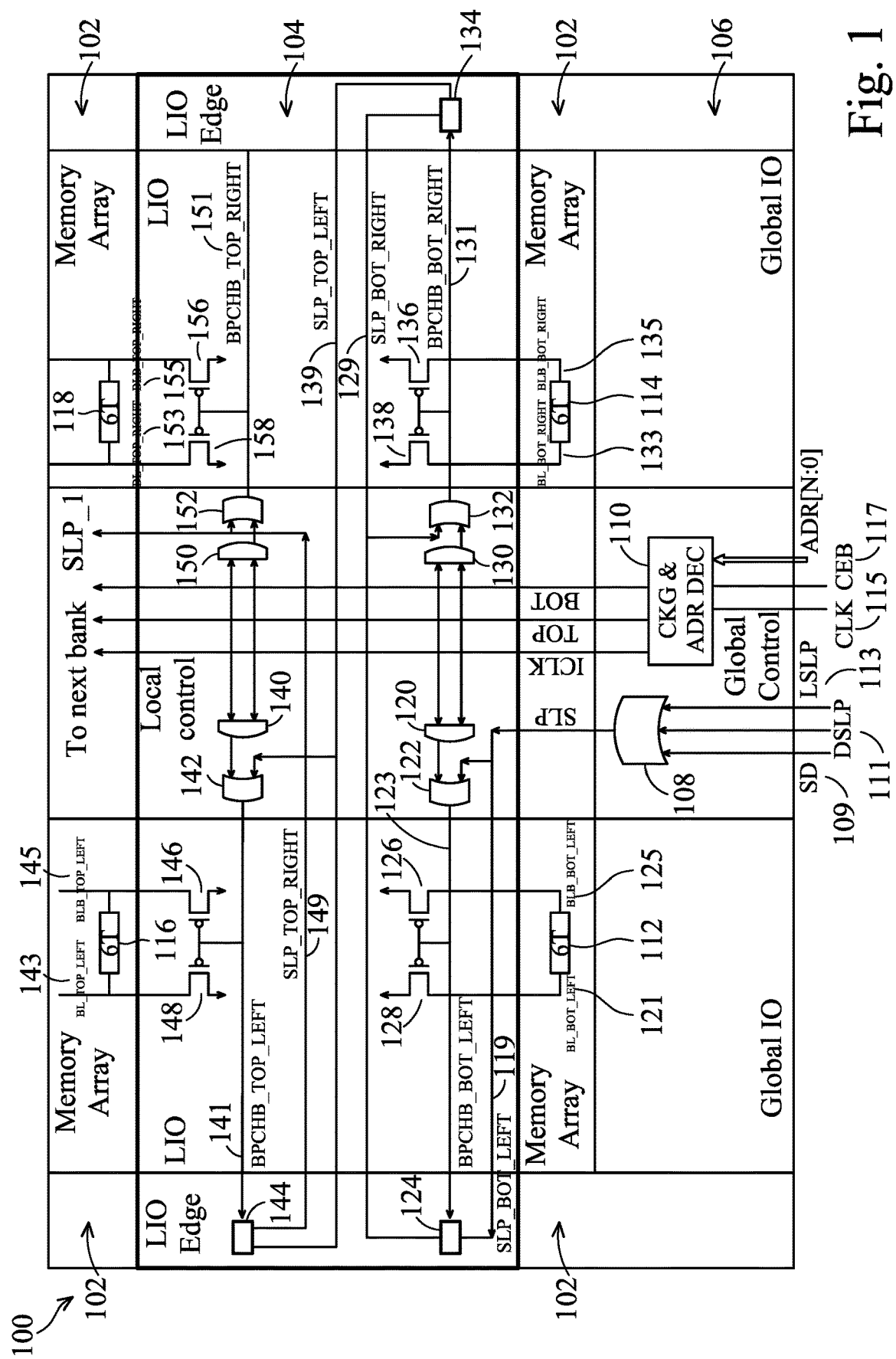
FIG. 1 is a diagram of an example power management circuit for a semiconductor memory (e.g., SRAM).

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Systems and methods for power management in a memory system are described herein. In embodiments, a latch circuit (such as an SR latch) is added to a semiconductor memory system (e.g., SRAM) to track the bit line pre-charge signal in order to reduce peak current when coming out of power management mode (e.g., shut-down, deep sleep, and light sleep). In this way, a sequential bit line pre-charge operation within a memory bank may be achieved, and consequentially, wake-up peak current may be reduced in comparison to existing SRAM architectures.

FIG. 1 is a diagram of an example power management circuit 100 for a semiconductor memory (e.g., SRAM). The example power management circuit 100 includes a memory array 102 having a plurality of memory cells that are controlled by a local input/output (I/O) system 104 and a global I/O system 106. The global I/O system 106 includes logic circuitry 108 that generates a sleep signal (SLP), and a clock generator and address decoder 110 that generates clock (ICLK) and addressing signals (TOP, BOT) for selecting a memory cell in the memory array 102 for read or write operations. Specifically, in the illustrated embodiment, the global I/O system 106 includes an OR gate 108 that generates the sleep signal (SLP) as a function of power management signals that include a shut-down mode (SD) signal 109, a deep sleep mode (DSLP) signal 111, and a light sleep mode (LSLP) signal 113. These three modes (SD, DSLP and LSLP) control power management for the memory system. For example, in light sleep mode, the bit line pre charge circuit and word line drivers may be turned off, in deep sleep mode, the memory logic may be turned off, and in shut-down mode, the entire memory circuit may be turned off. The clock generator and address decoder 110, in the illustrated embodiment, generates the clock signal (ICLK) as function of a global clock signal 115 (CLK) and a chip enable signal 117 (CEB), and generates address signals (TOP, BOT) as function of an address word (ADR[N:0]) and the chip enable signal 117(CEB).

The local I/O system 104 includes logic circuitry for each of the memory cells in the memory array 102 that generate bit line pre-charge (BPCHB) signals for controlling power to the bit lines of the respective memory cells as a function of the sleep signal (SLP) and clock (ICLK) and address (TOP, BOT) signals. The local I/O system 104 further includes a plurality of SR latches that latch the sleep signal (SLP) and are respectively controlled by the bit line pre-charge (BPCHB) signals such that a transition of the sleep signal (SLP) indicating a memory wake-up operation (e.g., coming out of shut-down, deep sleep, or light sleep) causes the plurality of memory cells in the memory array 102 to receive power in a sequential manner.

In the illustrated embodiment, the memory array 102 includes a first (bottom-left) memory cell 112, a second (bottom-right) memory cell 114, a third (top-left) memory cell 116, and a fourth (top-right) memory cell 118. The sleep signal (SLP) from the global I/O system 106 is received in the local I/O system 104 as a sleep signal 119 (SLP_BOT_LEFT) for the bottom-left memory cell 112 in the illustrated embodiment.

The sleep signal 119 (SLP_BOT_LEFT) is input to the logic circuitry 120, 122 for the bottom-left memory cell 112, along with clock (ICLK) and addressing (TOP, BOT) signals. More particularly, the logic circuit for the bottom-left memory cell 112 includes a first logic (AND) gate 120 with inputs that receive the addressing (TOP, BOT) signals, and a second logic (OR) gate 122 with inputs that receive the output of the first logic gate 120 and the sleep signal 119 (SLP_BOT_LEFT). The output of the second logic (OR) gate 122 provides the bit line pre-charge signal 123 (BPCHB_BOT_LEFT) for switching circuitry in the bottom-left memory cell 112. Specifically, the bit line pre-charge signal 123 (BPCHB_BOT_LEFT) is received at the gate terminals of a pair of PMOS transistors 126, 128, which include source terminals that are coupled to a supply voltage, and drain terminals that are respectively coupled to the bit line 121 (BL_BOT_LEFT) and bit line bar 125 (BLB_BOT_LEFT) inputs of the bottom-left memory cell 112.

In response to a transition of the sleep signal 119 (SLP_BOT_LEFT) indicating a memory wake-up operation, the logic circuit 120, 122 for the bottom-left memory cell 112 generates a logic state on the bit line pre-charge signal 123 (BPCHB_BOT_LEFT) that causes power to be supplied to pre-charge the memory cell bit lines 121, 125 (BL_BOT_LEFT and BLB_BOT_LEFT). More specifically, the PMOS transistors 126, 128 are controlled by the bit line pre-charge signal 123 (BPCHB_BOT_LEFT) to provide power to the memory cell 112 bit lines 121, 125 (BL_BOT_LEFT and BLB_BOT_LEFT) in order to initialize the bit line voltages as the memory array 102 is powered on in response to a memory wake-up operation (e.g., coming out of shut-down, deep sleep, or light sleep.) An example of this operation is illustrated in the timing diagram 200 shown in FIG. 2.

Figure 2:
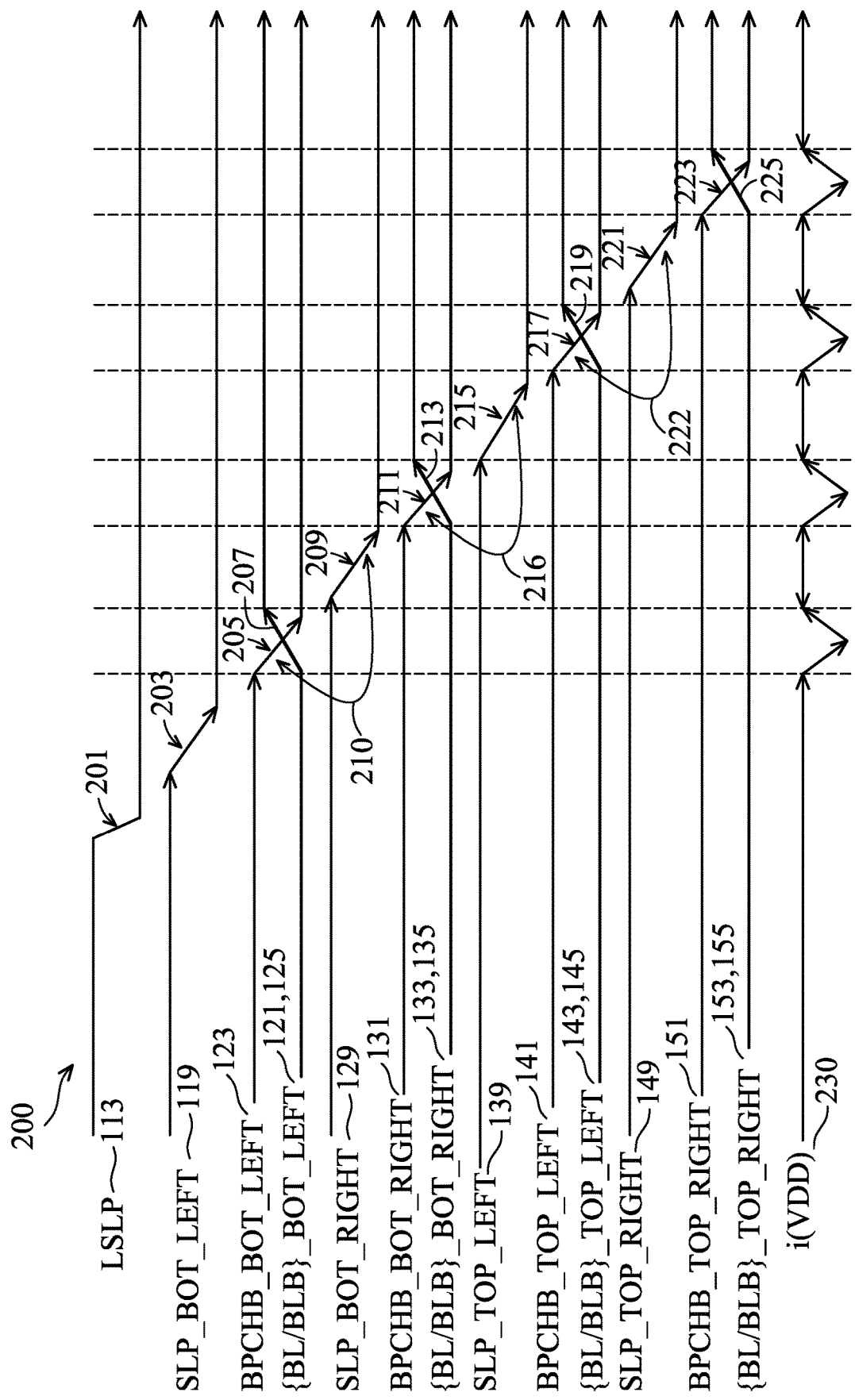
FIG. 2 is a timing diagram showing an example operation of the power management circuit of FIG. 1.

With reference to FIG. 2, the wake-up operation is initiated by a logic high to logic low transition 201 in the sleep signal 113 (LSLP) received by the global I/O system 106. The logic state transition 201 of the sleep signal 113 (LSLP) causes a corresponding logic state transition 203 in the sleep signal 119 (SLP_BOT_LEFT) received by the local I/O system 104. As detailed above with reference to FIG. 1, the logic state transition 203 in the sleep signal 119 (SLP_BOT_LEFT) causes the logic circuit 120, 122 for the bottom-left memory cell 112 to transition 205 the logic state of the bit line pre-charge signal 123 (BPCHB_BOT_LEFT), which causes power to be supplied to pre-charge memory cell bit lines 121, 125 (BL_BOT_LEFT and BLB_BOT_LEFT). The pre-charging of memory cell bit lines 121, 125 (BL_BOT_LEFT and BLB_BOT_LEFT) can be seen in the timing diagram 200 of FIG. 2 by the voltage transition 207 that occurs in response to the logic state transition 205 of the bit line pre-charge signal 123 (BPCHB_BOT_LEFT).

With reference again to FIG. 1, the sleep signal 119 (SLP_BOT_LEFT) and bit line pre-charge signal 123 (BPCHB_BOT_LEFT) are also received as inputs to a first latch circuit 124. The first latch circuit 124 generates a first delayed sleep signal 129 (SLP_BOT_RIGHT) in response to the sleep signal 119 (SLP_BOT_LEFT) and bit line pre-charge signal 123 (BPCHB_BOT_LEFT), such that the logic state of the first delayed sleep signal 129 (SLP_BOT_RIGHT) does not transition (indicating a wake-up operation) until after the bit line voltages 121, 125 (BL_BOT_LEFT and BLB_BOT_LEFT) of the bottom-left memory cell 112 have been initialized.

As shown in the timing diagram 200 of FIG. 2, the first delayed sleep signal 129 (SLP_BOT_RIGHT) begins a logic state transition 209 only after the bit line pre-charge signal 123 (BPCHB_BOT_LEFT) has transitioned from logic high to logic low. This causes a time delay 210 between pre-charging of the bit line voltages 121, 125 (BL_BOT_LEFT and BLB_BOT_LEFT) of the bottom-left memory cell 112 and the initiation of wake-up operations for the bottom-right memory cell 114.

With reference again to FIG. 1, the first delayed sleep signal 129 (SLP_BOT_RIGHT) is provided as a sleep signal input to a logic circuit 130, 132 for the bottom-right memory cell 114 and also as an input to a second latch circuit 134. The logic circuit for the bottom-right memory cell 114 includes a first logic (AND) gate 130 with inputs that receive the addressing (TOP, BOT) signals, and a second logic (OR) gate 132 with inputs that receive the output of the first logic gate 130 and the first delayed sleep signal 129 (SLP_BOT_RIGHT). The output of the second logic (OR) gate 132 provides the bit line pre-charge signal 131 (BPCHB_BOT_RIGHT) for switching circuitry in the bottom-right memory cell 114. Specifically, the bit line pre-charge signal 131 (BPCHB_BOT_RIGHT) is received at the gate terminals of a pair of PMOS transistors 136, 138, which include source terminals that are coupled to a supply voltage, and drain terminals that are respectively coupled to the bit line 133 (BL_BOT_RIGHT) and bit line bar 135 (BLB_BOT_RIGHT) inputs of the bottom-right memory cell 114.

In response to a transition of the first delayed sleep signal 129 (SLP_BOT_RIGHT) indicating a memory wake-up operation, the logic circuit 130, 132 for the bottom-right memory cell 114 generates a logic state on the bit line pre-charge signal 131 (BPCHB_BOT_RIGHT) that causes the PMOS transistors 136, 138 to supply power to pre-charge the memory cell bit lines 133, 135 (BL_BOT_RIGHT and BLB_BOT_RIGHT). As shown in the timing diagram of FIG. 2, the logic state transition 209 in the first delayed sleep signal 129 (SLP_BOT_RIGHT) causes the logic circuit 130, 132 for the bottom-right memory cell 114 to transition 211 the logic state of the bit line pre-charge signal 131(BPCHB_BOT_RIGHT), which causes power to be supplied to pre-charge memory cell bit lines 133, 135 (BL_BOT_RIGHT and BLB_BOT_RIGHT). The pre-charging of memory cell bit lines 133, 135 (BL_BOT_RIGHT and BLB_BOT_RIGHT) can be seen in the timing diagram 200 of FIG. 2 by the voltage transition 213 that occurs in response to the logic state transition 211 of the bit line pre-charge signal 131 (BPCHB_BOT_RIGHT).

With reference again to FIG. 1, the first delayed sleep signal 129 (SLP_BOT_RIGHT) and bit line pre-charge signal 131 (BPCHB_BOT_RIGHT) are also received as inputs to the second latch circuit 134, which generates a second delayed sleep signal 139 (SLP_TOP_LEFT). The generation of the second delayed sleep signal 139 (SLP_TOP_LEFT) by the second latch circuit 134 is delayed such that the logic state of the second delayed sleep signal 139 (SLP_TOP_LEFT) does not transition (indicating a wake-up operation) until after the bit line voltages 133, 135 (BL_BOT_RIGHT and BLB_BOT_RIGHT) of the bottom-right memory cell 114 have been initialized.

As shown in the timing diagram 200 of FIG. 2, the second delayed sleep signal 139 (SLP_TOP_LEFT) begins a high-to-low logic state transition 215 only after the bit line pre-charge signal 131 (BPCHB_BOT_RIGHT) has transitioned from logic high to logic low. This causes a time delay 216 between pre-charging of the bit line voltages 133, 135 (BL_BOT_RIGHT and BLB_BOT_RIGHT) of the bottom-right memory cell 114 and the initiation of wake-up operations for the top-left memory cell 116.

With reference again to FIG. 1, the second delayed sleep signal 139 (SLP_TOP_LEFT) is provided as a sleep signal input to a logic circuit 140, 142 for the top-left memory cell 116 and also as an input to a third latch circuit 144. The logic circuit for the top-left memory cell 116 includes a first logic (AND) gate 140 with inputs that receive the addressing (TOP, BOT) signals, and a second logic (OR) gate 142 with inputs that receive the output of the first logic gate 140 and the second delayed sleep signal 139 (SLP_TOP_LEFT). The output of the second logic (OR) gate 142 provides the bit line pre-charge signal 141 (BPCHB_TOP_LEFT) for switching circuitry in the top-left memory cell 116. Specifically, the bit line pre-charge signal 141 (BPCHB_TOP_LEFT) is received at the gate terminals of a pair of PMOS transistors 146, 148, which include source terminals that are coupled to a supply voltage, and drain terminals that are respectively coupled to the bit line 143 (BL_TOP_LEFT) and bit line bar 145 (BLB_TOP_LEFT) inputs of the top-left memory cell 116.

In response to a transition of the second delayed sleep signal 139 (SLP_TOP_LEFT) indicating a memory wake-up operation, the logic circuit 140, 142 for the top-left memory cell 116 generates a logic state on the bit line pre-charge signal 141 (BPCHB_TOP_LEFT) that causes the PMOS transistors 146, 148 to supply power to pre-charge the memory cell bit lines 143, 145 (BL_TOP_LEFT and BLB_TOP_LEFT). As shown in the timing diagram of FIG. 2, the logic state transition 215 in the second delayed sleep signal 139 (SLP_TOP_LEFT) causes the logic circuit 140, 142 for the top-left memory cell 116 to transition 217 the logic state of the bit line pre-charge signal 141(BPCHB_TOP_LEFT), which causes power to be supplied to pre-charge memory cell bit lines 143, 145 (BL_TOP_LEFT and BLB_TOP_LEFT). The pre-charging of memory cell bit lines 143, 145 BL_TOP_LEFT and BLB_TOP_LEFT) can be seen in the timing diagram 200 of FIG. 2 by the voltage transition 219 that occurs in response to the logic state transition 217 of the bit line pre-charge signal 141 (BPCHB_TOP_LEFT).

With reference again to FIG. 1, the second delayed sleep signal 139 (SLP_TOP_LEFT) and bit line pre-charge signal 141 (BPCHB_TOP_LEFT) are also received as inputs to the third latch circuit 144, which generates a third delayed sleep signal 149 (SLP_TOP_RIGHT). The generation of the third delayed sleep signal 149 (SLP_TOP_RIGHT) by the third latch circuit 144 is delayed such that the logic state of the third delayed sleep signal 149 (SLP_TOP_RIGHT) does not transition (indicating a wake-up operation) until after the bit line voltages 143, 145 (BL_TOP_LEFT and BLB_TOP_LEFT) of the top-left memory cell 116 have been initialized.

As shown in the timing diagram 200 of FIG. 2, the third delayed sleep signal 149 (SLP_TOP_RIGHT) begins a high-to-low logic state transition 221 only after the bit line pre-charge signal 141 (BPCHB_TOP_LEFT) has transitioned from logic high to logic low. This causes a time delay 222 between pre-charging of the bit line voltages 143, 145 (BL_TOP_LEFT and BLB_TOP_LEFT) of the top-left memory cell 116 and the initiation of wake-up operations for the top-right memory cell 118.

With reference again to FIG. 1, the third delayed sleep signal 149 (SLP_TOP_RIGHT) is provided as a sleep signal input to a logic circuit 150, 152 for the top-right memory cell 118. The logic circuit for the top-right memory cell 118 includes a first logic (AND) gate 150 with inputs that receive the addressing (TOP, BOT) signals, and a second logic (OR) gate 152 with inputs that receive the output of the first logic gate 150 and the third delayed sleep signal 149 (SLP_TOP_RIGHT). The output of the second logic (OR) gate 152 provides the bit line pre-charge signal 151 (BPCHB_TOP_RIGHT) for switching circuitry in the top-right memory cell 118. Specifically, the bit line pre-charge signal 151 (BPCHB_TOP_RIGHT) is received at the gate terminals of a pair of PMOS transistors 156, 158, which include source terminals that are coupled to a supply voltage, and drain terminals that are respectively coupled to the bit line 153 (BL_TOP_RIGHT) and bit line bar 155 (BLB_TOP_RIGHT) inputs of the top-right memory cell 118.

In response to a transition of the third delayed sleep signal 149 (SLP_TOP_RIGHT) indicating a memory wake-up operation, the logic circuit 150, 152 for the top-right memory cell 118 generates a logic state on the bit line pre-charge signal 151 (BPCHB_TOP_RIGHT) that causes the PMOS transistors 156, 158 to supply power to pre-charge the memory cell bit lines 153, 155 (BL_TOP_RIGHT and BLB_TOP_RIGHT). As shown in the timing diagram of FIG. 2, the logic state transition 221 in the third delayed sleep signal 149 (SLP_TOP_RIGHT) causes the logic circuit 150, 152 for the top-right memory cell 118 to transition 223 the logic state of the bit line pre-charge signal 151 (BPCHB_TOP_RIGHT), which causes power to be supplied to pre-charge memory cell bit lines 153, 155 (BL_TOP_RIGHT and BLB_TOP_RIGHT). The pre-charging of memory cell bit lines 153, 155 (BL_TOP_RIGHT and BLB_TOP_RIGHT) can be seen in the timing diagram 200 of FIG. 2 by the voltage transition 225 that occurs in response to the logic state transition 223 of the bit line pre-charge signal 151 (BPCHB_TOP_RIGHT).

In this manner, the bit lines of the four memory cells 112, 114, 116, 118 in the example embodiment 100 are pre-charged in a sequential fashion, as illustrated in the example timing diagram 200 shown in FIG. 2. As further shown in FIG. 2, the sequential wake-up operation causes the resulting wake-up current draw 230 to occur during four separate intervals, reducing the peak wakeup current in comparison to systems that perform simultaneous wake-up operations on multiple memory cells.

FIGS. 3A-3C depict an example of an SR latch 300 that may, for example, be utilized as one or more of the latch circuits 124, 134, 144 in FIG. 1. As shown in FIG. 3A, the example SR latch 300 includes a pair of logic (NOR) gates 302, 304 and a pair of inverters 306, 308. The logic (NOR) gates 302, 304 are connected in a feedback configuration with the output of a first logic (NOR) gate 302 coupled to an input of a second logic (NOR) gate 304, and the output of the second logic (NOR) gate 304 coupled as an input to the first logic (NOR) gate 302. A first inverter 306 is coupled to a second input of the first logic gate 302, and a second inverter 308 is coupled to the output of the second logic (NOR) gate 304. A bit line pre-charge signal (e.g., BLPCHB_BOT_LEFT) is coupled as the input to the first inverter 306, and a first sleep signal (e.g., SLP_BOT_LEFT) is coupled as the second input to the second logic (NOR) gate 304. The output of the second inverter 308 provides a delayed sleep signal (e.g., SLP_BOT_RIGHT).

A logic state table 310 for the example SR latch 300 is shown at FIG. 3B. As shown in the first row 312 of the table 310, when both the first sleep signal (e.g., SLP_BOT_LEFT) and the bit line pre-charge signal (e.g., BLPCHB_BOT_LEFT) are in a logic low state, the delayed sleep signal (e.g., SLP_BOT_RIGHT) will also be in a logic low state, indicating a standby mode for the memory cell. As detailed above with reference to FIG. 2, when the first sleep signal (e.g., SLP_BOT_LEFT) and the bit line pre-charge signal (e.g., BLPCHB_BOT_LEFT) are both in a logic low state—indicating a standby mode—the bit line voltages for the memory cell will pre-charge.

As shown in the second row 314 of the logic state table 310, when the first sleep signal (e.g., SLP_BOT_LEFT) is in a logic low state and the bit line pre-charge signal (e.g., BLPCHB_BOT_LEFT) is in a logic high state, the delayed sleep signal (e.g., SLP_BOT_RIGHT) will be in a logic low state, and the memory cell will be in read/write (RD/WR) mode.

As shown in the third row 316 of the logic table 310, a state when the first sleep signal (e.g., SLP_BOT_LEFT) is in a logic high state and the bit line pre-charge signal (e.g., BLPCHB_BOT_LEFT) is in a logic low state is not possible. This state is not possible because a logic high state on the first sleep signal (e.g., SLP_BOT_LEFT) will also cause a logic high state on the bit line pre-charge signal (e.g., BLPCHB_BOT_LEFT).

As shown in the fourth row 318 of the logic table 310, when both the first sleep signal (e.g., SLP_BOT_LEFT) and the bit line pre-charge signal (e.g., BLPCHB_BOT_LEFT) are in a logic high state, the delayed sleep signal (e.g., SLP_BOT_RIGHT) will also be in a logic high state, indicating a sleep mode for the memory cell.

A timing diagram 320 for the example SR latch 300 is shown in FIG. 3C. The timing diagram 320 shows an example operation of the SR latch 300 used as the first SR latch 124 in the memory system shown in FIG. 1. At time period 330 in the illustrated example, a memory assertion operation is initiated to enter into a power management mode (SD or DSLP or LSLP). As shown, if any of the power management signals (SD, DSLP or LSLP) transitions from a logic low state to a logic high state, a power management mode is asserted depending on which power management signal is at logic high. For example, a logic high state on the LSLP signal may initiate a light sleep mode. As shown in the timing diagram 320, a logic high state on a power management signal (SD, DSLP or LSLP) causes the sleep signal 119 (SLP_BOT_LEFT) to also transition from logic low to logic high. As a result of a logic high state on the sleep signal 119 (SLP_BOT_LEFT), the bit line pre-charge signal 123 (BPCHB_BOT_LEFT) transitions from a logic low state to a logic high state, as shown in the timing diagram at reference 332. The logic high state on the bit line pre-charge signal 123 (BPCHB_BOT_LEFT) disables the bit line pre charge circuit, as described above with reference to FIG. 1, and the bit lines ({BL/BLB}_BOT_LEFT) 121, 125 discharge, as shown at reference 334 in the timing diagram. In addition, the sleep signal 119 (SLP_BOT_LEFT) is input to the latch circuit 124 along with the bit line pre-charge signal 123 (BPCHB_BOT_LEFT), as described above with reference to FIG. 1, and therefore the logic high state on both of these signal 119, 123 causes the delayed sleep signal 129 (SLP_BOT_RIGHT) to quickly transition to logic high, as shown in the timing diagram at reference 336, which causes bit lines in the next (BT_RIGHT) memory cell to also start discharging. In this way, during assertion, the latch circuit 124 allows the sleep signal to quickly propagate between memory cells, without being delayed by the bit line pre-charge signal.

At time period 350 in the illustrated example, a memory wake-up operation is initiated by a logic high to logic low state change of one or more of the SD 109, DSLP 111, and LSLP 113 signals received by the global I/O system 106 in FIG. 1. In response, the sleep signal 119 (SLP_BOT_LEFT) transitions from logic high to logic low, initiating the wake-up operation in the memory cell 112. The state change in the sleep signal 119 (SLP_BOT_LEFT) causes a logic high to logic low state change in the bit line pre-charge signal 123 (BPCHB_BOT_LEFT), resulting in a voltage increase (i.e., pre-charge) in the memory cell bit lines 121, 125 ({BL/BLB}_BOT_LEFT), as described above with reference to FIG. 1. When both the sleep signal 119 (SLP_BOT_LEFT) and the bit line pre-charge signal 123 (BPCHB_BOT_LEFT) have transitioned to a logic low state, the SR latch 300 will cause the delayed sleep signal 129 (SLP_BOT_RIGHT) to transition to a logic low state, as described above with reference to FIGS. 3A and 3B. The operation of the SR latch 300 thus results in a delay 355 between initiation of bit cell pre-charging in the current memory cell and initiation of memory wake-up operations in the next memory cell of the array.

Figure 4:
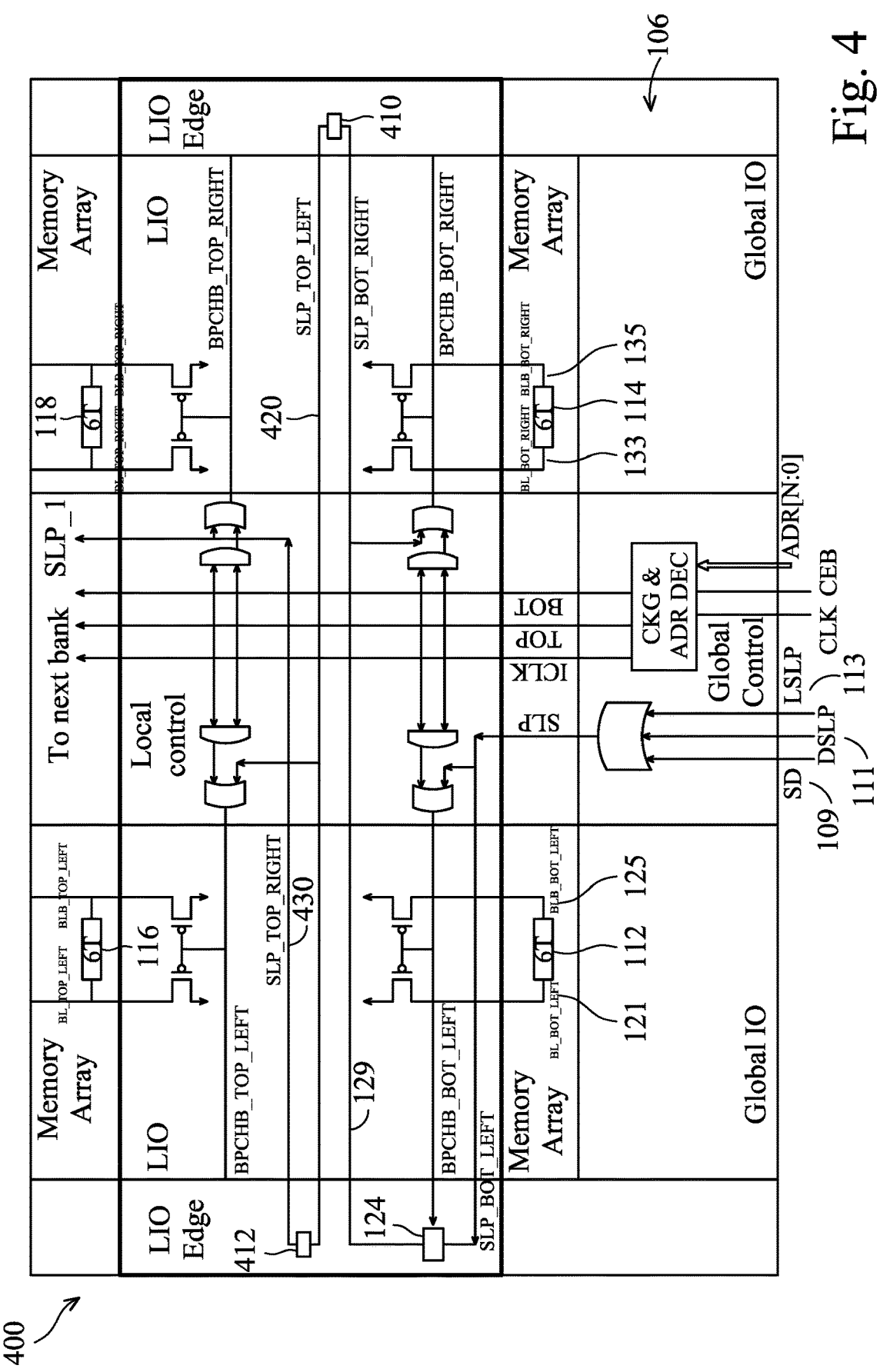
FIG. 4 is a diagram of another example power management circuit for a semiconductor memory (e.g., SRAM).

FIG. 4 is a diagram of another example power management circuit 400 for a semiconductor memory (e.g., SRAM). The example 400 shown in FIG. 4 is the same as the example power management circuit 100 shown in FIG. 1, except that the example 400 shown in FIG. 4 utilizes only one latch circuit 124 and replaces the subsequent latch circuits with delay circuits 410 and 412. The delay circuits 410 and 412 may, for example, be buffers that each include a series of an even number of inverters. The length of the signal delay caused by each delay circuit 410 and 412 may, for example, be determined by the number of inverters included in the buffer circuit.

When a memory wake-up operation is initiated by one or more of the SD 109, DSLP 111, and LSLP 113 signals received by the global I/O system 106, the bit lines 121, 125 (BL_BOT_LEFT and BLB_BOT_LEFT) for the bottom-left memory cell 112 are pre-charged, and a first delayed sleep signal 129 is generated by the latch circuit 124 in the same way as described above with reference to the embodiment shown in FIG. 1. The first delayed sleep signal 129 also causes the bit lines 133, 135 (BL_BOT_RIGHT and BLB_BOT_RIGHT) to be pre-charged, as describe above with reference to FIG. 1. However, the subsequent delayed sleep signals 420 and 430 (SLP_TOP_LEFT and SLP_TOP_RIGHT) in this embodiment 400 are respectively generated by the delay circuits 410 and 412. In this way, initiation of the memory wake-up operation for the top-left memory cell 116 is delayed by an amount of time ($D_1$) from initiation of the memory wake-up operation for the bottom-right memory cell 114, and initiation of the memory wake-up operation for the top-right memory cell 118 is delayed by an amount of time (D₂) from initiation of the memory wake-up operation for the top-left memory cell 116. The length of the time delays (D1 and D2) may be determined by the size of the respective delay circuits 410 and 412 (e.g., by selecting the number of inverters), and may be configured such that the bit lines of the four memory cells 112, 114, 116, 118 are pre-charged in a sequential fashion, similar to (or the same as) the sequential bit line pre-charging that results from the embodiment of FIG. 1.

Figure 5:
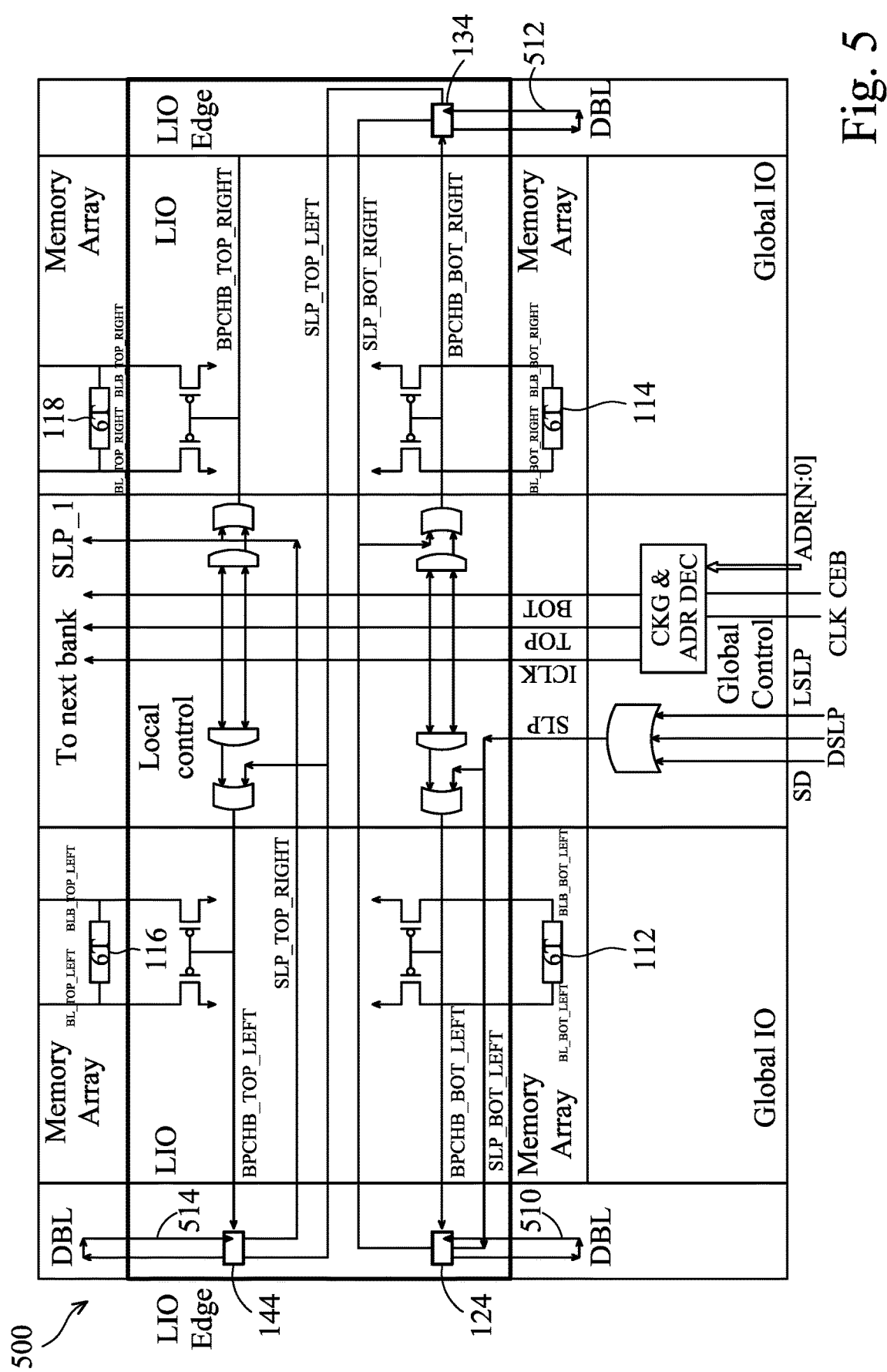
FIG. 5 is a third example of a power management circuit for a semiconductor memory (e.g., SRAM).

FIG. 5 is a third example of a power management circuit 500 for a semiconductor memory (e.g., SRAM). The example 500 shown in FIG. 5 is the same as the example power management circuit 100 shown in FIG. 1, except that in the example 500 shown in FIG. 5 the latch circuits 124, 134 and 144 also respectively include bit line delay tracking elements 510, 512 and 514. The bit line delay tracking elements 510, 512 and 514 may, for example, be delay circuits that are configured to mimic the RC delay caused by the bit lines of the respective memory elements 112, 114 and 116. The bit line delay tracking elements 510, 512, 514 may, for example, be implemented by adding additional traces to the semiconductor layout, where the length of the additional traces are selected to cause an amount of delay that mimics the RC delay caused by the bit line parasitic (RC product) delay.

Figure 6:
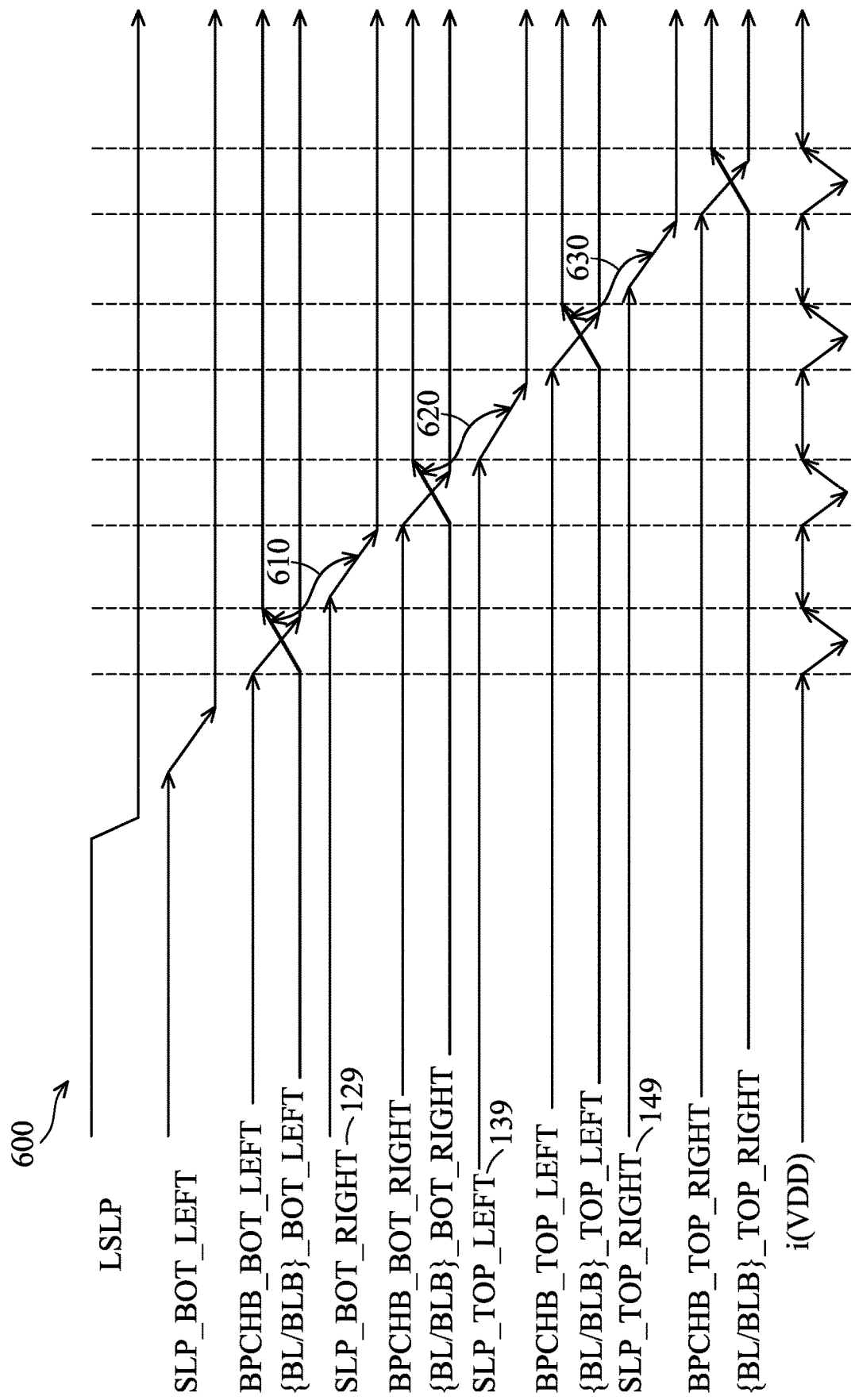
FIG. 6 is a timing diagram showing an example operation of the power management circuit of FIG. 5.

FIG. 6 is a timing diagram 600 showing an example operation of the power management circuit 500 of FIG. 5. The example power management operation 600 shown in FIG. 6 is similar to the power management operation shown in FIG. 2, except that in this example 600 the logic high to logic low transitions of the delayed sleep signals 129, 139 and 149 are timed by the bit line delay tracking elements 510, 512, 514 to be triggered at the completion of bit line charging, as shown in the timing diagram at reference numerals 610, 620 and 630.

Figure 7:
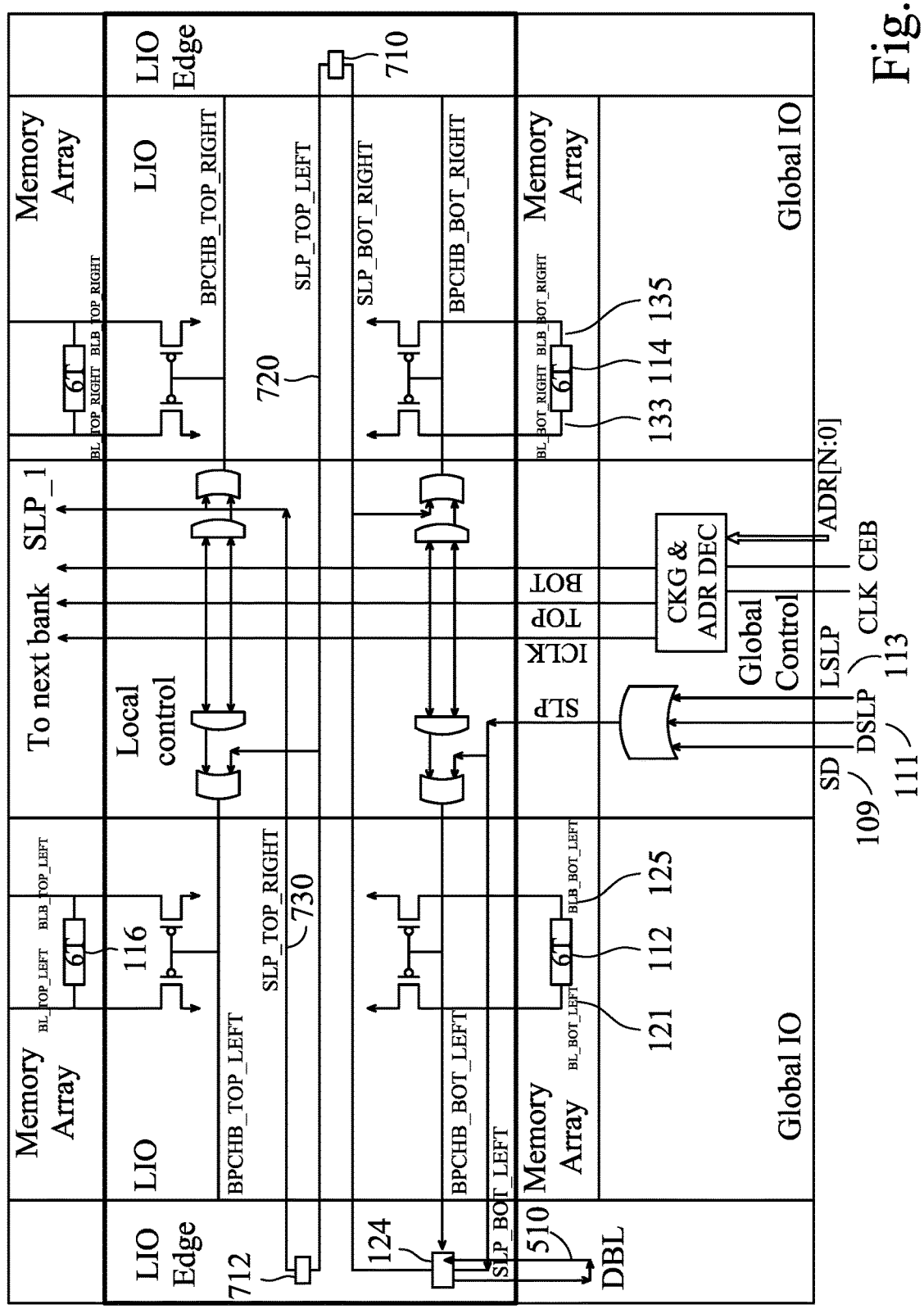
FIG. 7 is a diagram of a fourth example of a power management circuit for a semiconductor memory (e.g., SRAM).

FIG. 7 is a diagram of a fourth example of a power management circuit 700 for a semiconductor memory (e.g., SRAM). The example 700 shown in FIG. 7 is the same as the example power management circuit 500 shown in FIG. 5, except that the example 700 shown in FIG. 7 utilizes only one latch circuit 124 and corresponding bit line delay tracking element 510 and replaces the subsequent latch circuits and bit line delay tracking elements with delay circuits 710 and 712. The delay circuits 710 and 712 may, for example, be buffers that each include a series of an even number of inverters. The length of the signal delay caused by each delay circuit 710 and 712 may, for example, be determined by the number of inverters included in the buffer circuit.

When a memory wake-up operation is initiated by one or more of the SD 109, DSLP 111, and LSLP 113 signals received by the global I/O system, the bit lines 121, 125 (BL_BOT_LEFT and BLB_BOT_LEFT) for the bottom-left memory cell 112 are pre-charged, and a first delayed sleep signal 129 is generated by the bit line delay tracking element 510 and latch circuit 124 in the same way as described above with reference to the embodiment described above with reference to FIGS. 5 and 6. The first delayed sleep signal 129 also causes the bit lines 133, 135 (BL_BOT_RIGHT and BLB_BOT_RIGHT) to be pre-charged in the same way as describe above with reference to FIGS. 5 and 6. However, the subsequent delayed sleep signals 720 and 730 (SLP_TOP_LEFT and SLP_TOP_RIGHT) in this embodiment 700 are respectively generated by the delay circuits 710 and 712. In this way, initiation of the memory wake-up operation for the top-left memory cell 116 is delayed by an amount of time (D₁) from initiation of the memory wake-up operation for the bottom-right memory cell 114, and initiation of the memory wake-up operation for the top-right memory cell 118 is delayed by an amount of time (D₂) from initiation of the memory wake-up operation for the top-left memory cell 116. The length of the time delays (D1 and D2) may be determined by the size of the respective delay circuits 710 and 712 (e.g., by selecting the number of inverters), and may be configured such that the bit lines of the four memory cells 112, 114, 116, 118 are pre-charged in a sequential fashion, similar to (or the same as) the sequential bit line pre-charging that results from the embodiment of FIG. 5.

Figure 8:
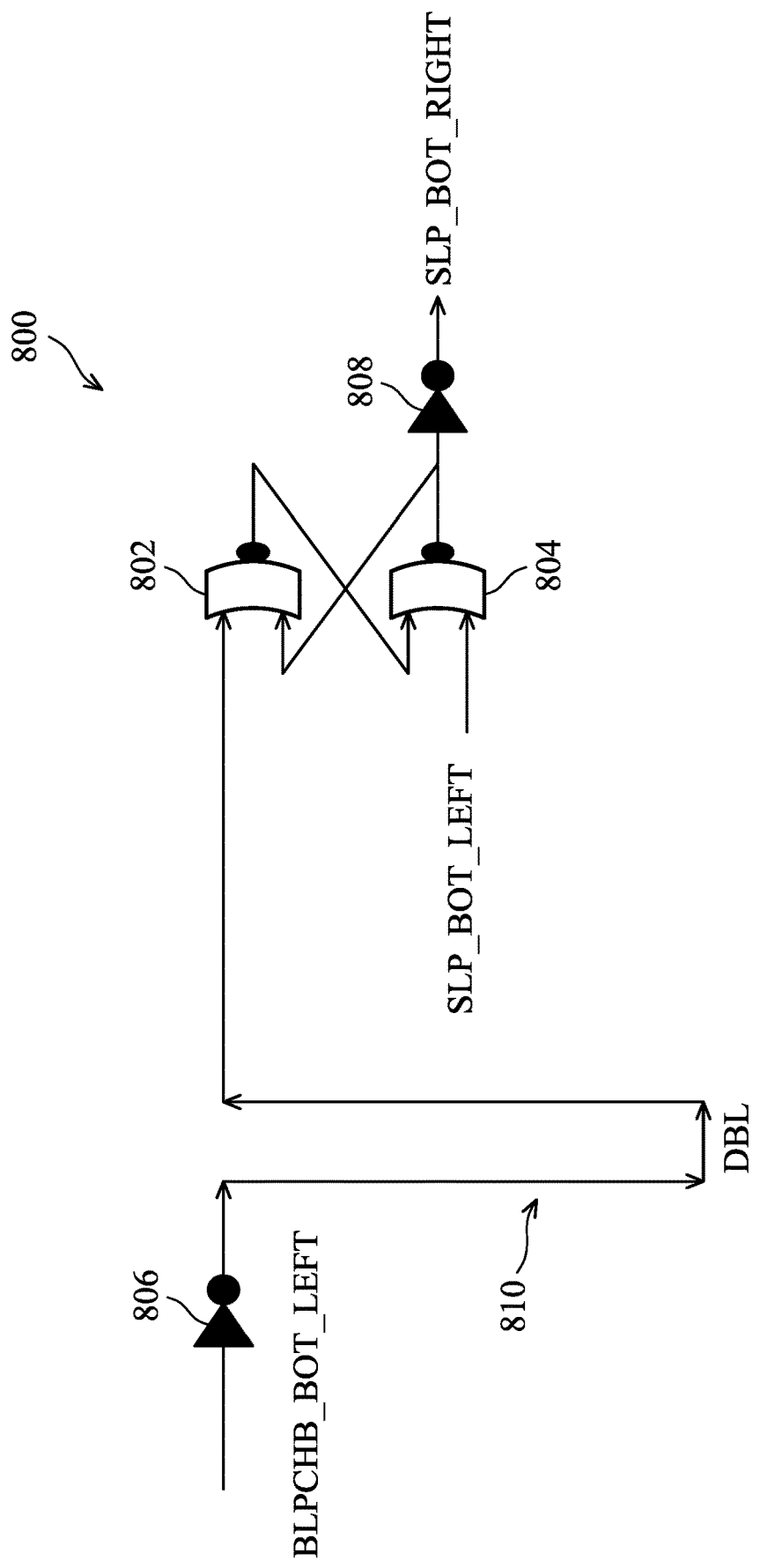
FIG. 8 depicts an example of an SR latch 800 with a bit line delay tracking element.

FIG. 8 depicts an example of an SR latch 800 with a bit line delay tracking element 810 that may, for example, be utilized for one or more of the latch circuits 124, 134, 144 and corresponding bit line delay tracking elements 510, 512 and 514 of FIG. 5. As shown in FIG. 8, the example SR latch 800 includes a pair of logic (NOR) gates 802, 804, a pair of inverters 806, 808. The logic (NOR) gates 802, 804 are connected in a feedback configuration with the output of a first logic (NOR) gate 802 coupled to an input of a second logic (NOR) gate 804, and the output of the second logic (NOR) gate 804 coupled as an input to the first logic (NOR) gate 802. A first inverter 806 is coupled to a second input of the first logic gate 802 via the bit line delay tracking element 810. A second inverter 808 is coupled to the output of the second logic (NOR) gate 304. A bit line pre-charge signal (e.g., BLPCHB_BOT_LEFT) is coupled as the input to the first inverter 806, and a first sleep signal (e.g., SLP_BOT_LEFT) is coupled as the second input to the second logic (NOR) gate 804. The output of the second inverter 808 provides a delayed sleep signal (e.g., SLP_BOT_RIGHT). In operation, the logic (NOR) gates 802, 804 and inverters 806, 808 provide a latch circuit that latches the sleep signal (e.g., SLP_BOT_LEFT) as a function of the bit line pre-charge signal (e.g., BLPCHB_BOT_LEFT). The bit line delay tracking element 810 provides a bit line delay (DBL) to the bit line pre-charge signal (e.g., BLPCHB_BOT_LEFT), for example by adding additional traces to the semiconductor layout, where the length of the additional traces are selected to cause an amount of delay that mimics the RC delay caused by the bit line parasitic (RC product) delay.

Figure 9:
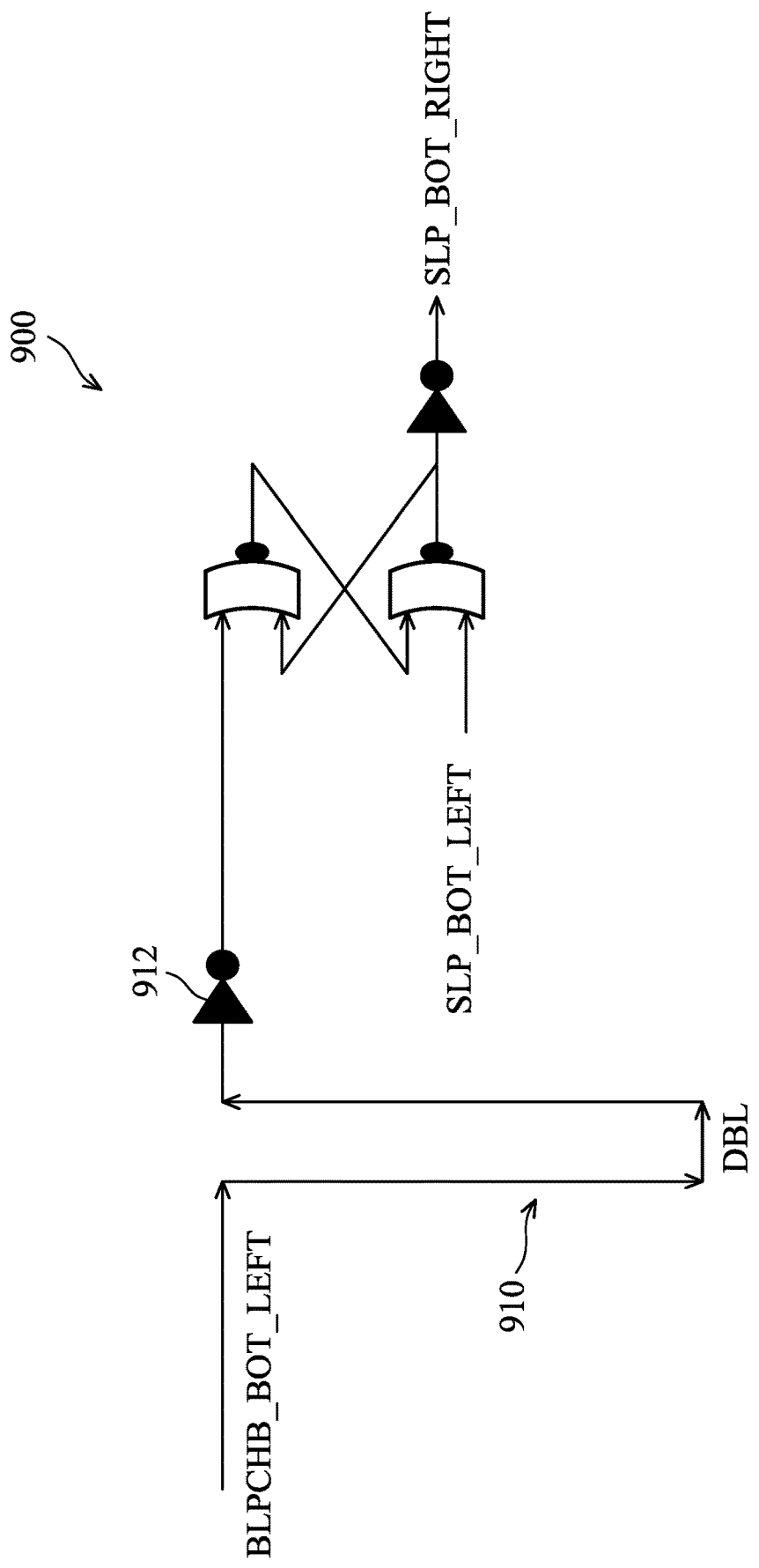
FIG. 9 depicts another example of an SR latch with a bit line delay tracking element.

FIG. 9 depicts another example of an SR latch 900 with a bit line delay tracking element 910 that may, for example, be utilized for one or more of the latch circuits 124, 134, 144 and corresponding bit line delay tracking elements 510, 512 and 514 of FIG. 5. This example 900 is the same as the example 800 shown in FIG. 8, except that the bit line delay tracking element 910 in the example shown in FIG. 9 is included before the first inverter 912.

Figure 10:
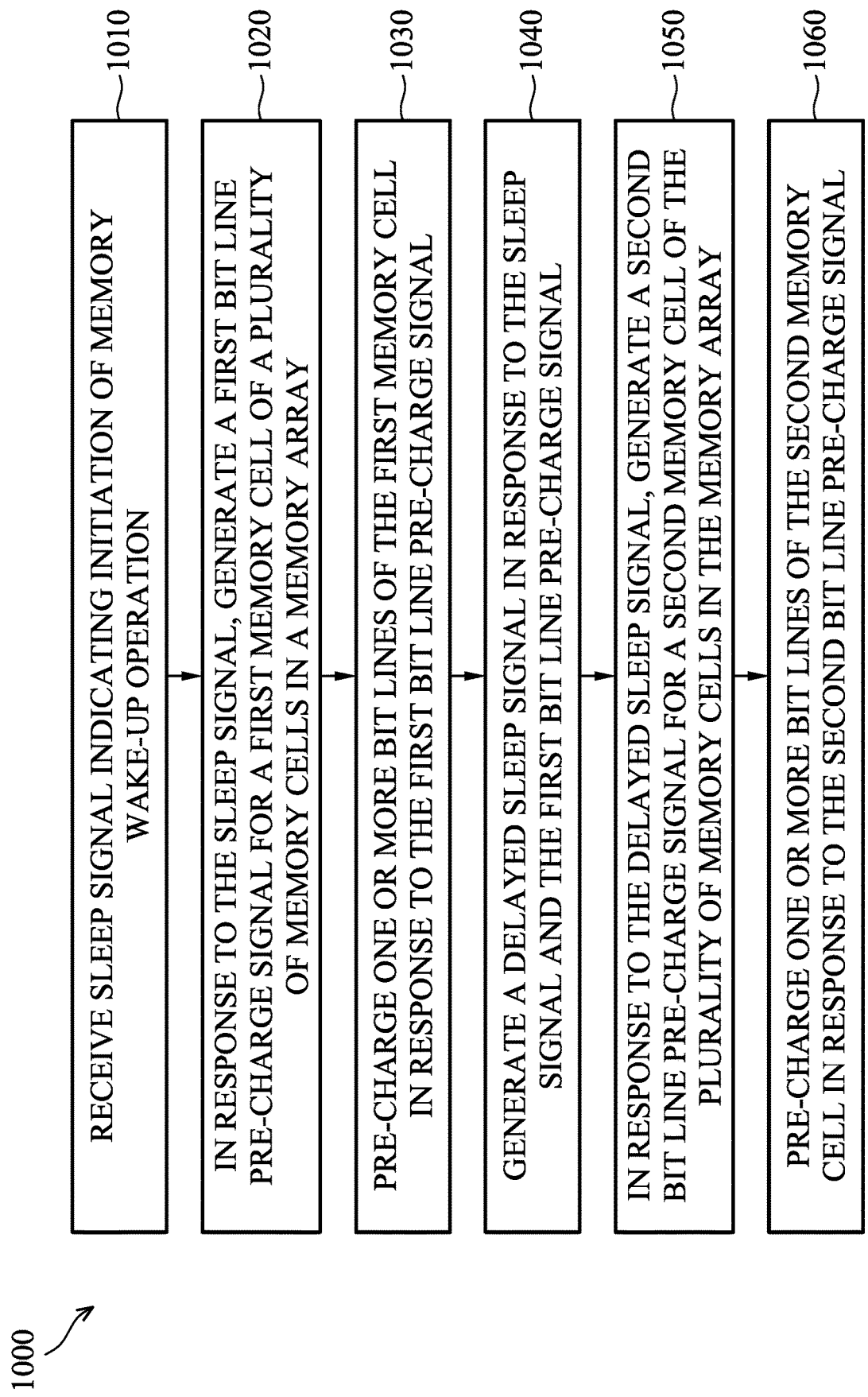
FIG. 10 is a flow diagram of an example method for controlling a wake-up operation for a memory array.

FIG. 10 is a flow diagram of an example method 1000 for controlling wake-up operations for a memory array that includes a plurality of memory cells. The method 1000 may, for example, be performed by one of the example memory circuits 100, 400, 500, 700 shown in FIGS. 1, 4, 5, and 7. At 1010, a sleep signal is received indicating initiation of a memory wake-up operation. The sleep signal may, for example, be received by the logic circuitry 120, 122 and latch circuit 124 shown in FIG. 1, 4, 5, or 7. At 1020, a first bit line pre-charge signal for a first memory cell of the plurality of memory cells is generated in response to the sleep signal. The first bit line pre-charge signal may, for example, be generated by the logic circuitry 120, 122 shown in FIG. 1, 4, 5, or 7. At 1030, one or more bit line of the first memory cell, such as bit lines 121 and 125 shown in FIG. 1, 4, or 7, are pre-charged in response to the first bit line pre-charge signal. At 1040, a delayed sleep signal is generated in response to the sleep signal and the first bit line pre-charge signal. The delayed sleep signal may, for example, be generated by the delay circuit 124 shown in FIG. 1 or 4, or by the delay circuit 124 with bit line delay tracking element 510 shown in FIG. 5 or 7. At 1050, a second bit line pre-charge signal is generated for a second memory cell of the plurality of memory cells in response to the delayed sleep signal. The second bit line pre-charge signal may, for example, be generated by the logic circuitry 130, 132 shown in FIG. 1, 4, 5, or 7. At 1060, one or more bit lines of the second memory cell, such as bit lines 133 and 135 shown in FIG. 1, 4, 5, or 7, are pre-charged in response to the second bit line pre-charge signal.

In one example, a memory circuit comprises a memory array with a plurality of memory cells, first logic circuitry, first switching circuitry, first latch circuitry, and second switching circuitry. The first logic circuitry may be configured to generate a first bit line pre-charge signal for a first memory cell of the plurality of memory cells, where the first bit line pre-charge signal is generated in response to a sleep signal. The first switching circuitry may be configured to provide power to one or more bit line of the first memory cell in response to the first bit line pre-charge signal. The first latch circuit may receive the sleep signal and the first bit line pre-charge signal and generate a delayed sleep signal. The second logic circuitry may be configured to generate a second bit line pre-charge signal for a second memory cell of the plurality of memory cells, where the second bit line pre-charge signal is generated in response to the delayed sleep signal. The second switching circuitry may be configured to provide power to one or more bit line of the second memory cell in response to the second bit line pre-charge signal.

In another example a method of controlling a wake-up operation for a memory array that includes a plurality of memory cells may include the steps of: receiving a sleep signal indicating an initiation of the wake-up operation; generating, at first logic circuitry, a first bit line pre-charge signal for a first memory cell of the plurality of memory cells, the first bit line pre-charge signal being generated in response to the sleep signal; pre-charging one or more bit line of the first memory cell in response to the first bit line pre-charge signal; generating, at a first latch circuit, a delayed sleep signal in response to the sleep signal and the first bit line pre-charge signal; generating, a second logic circuitry, a second bit line pre-charge signal for a second memory cell of the plurality of memory cells, the second bit line pre-charge signal being generated in response to the delayed sleep signal; and pre-charging one or more bit line of the second memory cell in response to the second bit line pre-charge signal.

In another example, a memory circuit comprises a memory array with a plurality of memory cells, first logic circuitry, first switching circuitry, a first latch circuit that includes a latch and a bit line delay tracking element, second logic circuitry, and second switching circuitry. The first logic circuitry may be configured to generate a first bit line pre-charge signal for a first memory cell of the plurality of memory cells, where the first bit line pre-charge signal is generated in response to a sleep signal. The first switching circuitry may be configured to provide power to one or more bit line of the first memory cell in response to the first bit line pre-charge signal. The latch may be configured to generate a delayed sleep signal in response to the sleep signal and the first bit line pre-charge signal. The bit line delay tracking element may be configured to delay operation of the latch by a time delay corresponding to an RC delay of the one or more bit line of the first memory cell. The second logic circuitry may be configured to generate a second bit line pre-charge signal for a second memory cell of the plurality of memory cells, where the second bit line pre-charge signal is generated in response to the delayed sleep signal. The second switching circuitry may be configured to provide power to one or more bit line of the second memory cell in response to the second bit line pre-charge signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory circuit comprising:
a pre-charge circuit configured to pre-charge a bit line in response to a first bit line pre-charge signal;
a first latch circuit configured to receive a sleep signal and the first bit line pre-charge signal and to generate a first delayed sleep signal; and
first logic circuitry configured to generate a second bit line pre-charge signal in response to the first delayed sleep signal.

2. The memory circuit of claim 1, wherein the first latch circuit is configured to cause a logic state transition in the first delayed sleep signal to occur after a logic state transition in the first bit line pre-charge signal.

3. The memory circuit of claim 1, further comprising:
second logic circuitry configured to generate the first bit line pre-charge signal in response to the sleep signal;
a second latch circuit configured to receive the first delayed sleep signal and the second bit line pre-charge signal and to generate a second delayed sleep signal; and
third logic circuitry configured to generate a third bit line pre-charge signal in response to the second delayed sleep signal.

4. The memory circuit of claim 3, wherein the second latch circuit is configured to cause a logic state transition in the second delayed sleep signal to occur after a logic state transition in the second bit line pre-charge signal.

5. The memory circuit of claim 3, further comprising:
a third latch circuit configured to receive the second delayed sleep signal and the third bit line pre-charge signal and to generate a third delayed sleep signal; and
fourth logic circuitry configured to generate a fourth bit line pre-charge signal in response to the third delayed sleep signal.

6. The memory circuit of claim 5, wherein the third latch circuit is configured to cause a logic state transition in the third delayed sleep signal to occur after a logic state transition in the third bit line pre-charge signal.

7. The memory circuit of claim 1, further comprising:
second logic circuitry configured to generate the first bit line pre-charge signal in response to the sleep signal;
a delay circuit configured to receive the first delayed sleep signal and to generate a second delayed sleep signal; and third logic circuitry configured to generate a third bit line pre-charge signal in response to the second delayed sleep signal.

8. The memory circuit of claim 7, wherein the delay circuit is configured to delay a logic state transition in the second delayed sleep signal until after a logic state transition in the second bit line pre-charge signal.

9. The memory circuit of claim 7, further comprising:
a second delay circuit configured to receive the second delayed sleep signal and to generate a third delayed sleep signal; and
fourth logic circuitry configured to generate a fourth bit line pre-charge signal in response to the third delayed sleep signal.

10. The memory circuit of claim 9, wherein the second delay circuit is configured to delay a logic state transition in the third delayed sleep signal until after a logic state transition in the third bit line pre-charge signal.

11. The memory circuit of claim 1, wherein the first latch circuit includes an SR latch.

12. A method comprising:
generating, at first logic circuitry, a first bit line pre-charge signal in response to a sleep signal;
pre-charging one or more bit lines in response to the first bit line pre-charge signal; and
generating, at a first latch circuit, a first delayed sleep signal in response to the sleep signal and the first bit line pre-charge signal.

13. The method of claim 12, further comprising:
generating, at second logic circuitry, a second bit line pre-charge signal in response to the first delayed sleep signal;
generating, at a second latch circuit, a second delayed sleep signal in response to the first delayed sleep signal and the second bit line pre-charge signal; and
generating, at third logic circuitry, a third bit line pre-charge signal in response to the second delayed sleep signal.

14. The method of claim 13, further comprising:
generating, at a third latch circuit, a third delayed sleep signal in response to the second delayed sleep signal and the third bit line pre-charge signal; and
generating, at fourth logic circuitry, a fourth bit line pre-charge signal in response to the third delayed sleep signal.

15. The method of claim 14, wherein the first delayed sleep signal, second delayed sleep signal, and third delayed sleep signal are generated sequentially.

16. The method of claim 12, further comprising:
generating, at second logic circuitry, a second bit line pre-charge signal in response to the first delayed sleep signal;
generating, at a delay circuit, a second delayed sleep signal; and
generating, at third logic circuitry, a third bit line pre-charge signal in response to the second delayed sleep signal.

17. The method of claim 16, further comprising:
generating, at a second delay circuit, a third delayed sleep signal; and
generating, at fourth logic circuitry, a fourth bit line pre-charge signal in response to the third delayed sleep signal.

18. The method of claim 17, wherein the delayed sleep signal, second delayed sleep signal, and third delayed sleep signal are generated sequentially.

19. The method of claim 12, further comprising delaying operation of the first latch circuit in generating the first delayed sleep signal by a time delay corresponding to an RC delay of the one or more bit lines.

20. A memory circuit comprising:
a pre-charge circuit configured to pre-charge a bit line in response to a first bit line pre-charge signal;
a latch circuit comprising:
a latch configured to generate a delayed sleep signal in response to a sleep signal and the first bit line pre-charge signal; and
a bit line delay tracking element configured to delay operation of the latch by a time delay corresponding to an RC delay of one or more bit lines; and
logic circuitry configured to generate a second bit line pre-charge signal in response to the delayed sleep signal.

* * * * *